United States Patent
Yang et al.

(10) Patent No.: US 9,385,453 B2
(45) Date of Patent: *Jul. 5, 2016

(54) CARD EDGE CONNECTOR WITH AN IMPROVED EJECTOR

(71) Applicant: FOXCONN INTERCONNECT TECHNOLOGY LIMITED, Grand Cayman (KY)

(72) Inventors: Xue Yang, Kunshan (CN); Teng Qin, Kunshan (CN); Xiao-Zhi Fu, Kunshan (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/795,074

(22) Filed: Jul. 9, 2015

(65) Prior Publication Data
US 2016/0013588 A1    Jan. 14, 2016

(30) Foreign Application Priority Data
Jul. 9, 2014    (CN) ..................... 2014 2 0377001 U

(51) Int. Cl.
H01R 13/62    (2006.01)
H01R 12/70    (2011.01)
H05K 7/14    (2006.01)
H01R 12/72    (2011.01)

(52) U.S. Cl.
CPC .......... *H01R 12/7029* (2013.01); *H05K 7/1409* (2013.01); *H01R 12/721* (2013.01)

(58) Field of Classification Search
CPC .............................. H01R 13/635; H01R 33/05
USPC .................................. 439/159, 156, 630, 631
See application file for complete search history.

(56) References Cited

U.S. PATENT DOCUMENTS

| | | | | |
|---|---|---|---|---|
| 5,660,552 A * | 8/1997 | Suzuki | ............... | H01R 12/7005 439/157 |
| 7,866,995 B1 * | 1/2011 | Kudo | ................... | H01R 12/721 439/157 |
| 7,955,099 B2 * | 6/2011 | Tan | ....................... | H01R 12/721 439/157 |
| 8,602,677 B2 * | 12/2013 | Peng | ....................... | G06F 1/185 361/801 |

FOREIGN PATENT DOCUMENTS

TW    M429217    5/2012

* cited by examiner

*Primary Examiner* — Phuongchi T Nguyen
(74) *Attorney, Agent, or Firm* — Wei Te Chung; Ming Chieh Chang

(57) ABSTRACT

A card edge connector includes an elongated insultive housing extending along a longitudinal direction, a plurality of conductive terminals retained in the insultive housing and an ejector retained at one longitudinal end of the insultive housing. The insultive housing defines a central slot recessed from an upper surface thereof for receiving a memory module. The ejector defines a base portion and a pair of gripping portions extending from the base portion along a vertical direction perpendicular to the longitudinal direction, said two gripping portions have an accommodating slot located therebetween and running therethrough in the longitudinal direction for receiving the memory module and a latching means located in the accommodating slot for locking the memory module. The latching means defines an opening communicating with said accommodating slot, a first lump portion and a second lump portion separated from each other by the opening.

20 Claims, 4 Drawing Sheets

CARD EDGE CONNECTOR WITH AN IMPROVED EJECTOR

BACKGROUND OF THE INVENTION

1. Field of the Invention

The present invention relates to a card edge connector, and more particularly to a card edge connector with an improved ejector assembled therein.

2. Description of the Related Art

Card edge connector is usually assembled on a mother board and then engages with a daughter board for interconnecting between the two boards. Taiwan Pat. No. M429217 issued on May 11, 2012 with a counterpart US Pat. No. 8,858,257, discloses a card edge connector including an elongated insulative housing extending along a left-to-right direction, a plurality of conductive terminals retained in the insulative housing and an ejector assembled to a side of the insulative housing. The insulative housing defines a central slot recessed from the upper surface thereof and used for receiving a memory module. The ejector defines a base portion and two gripping portions extending upwardly from two sides of the base portion, two gripping portions have a accommodating slot located therebetween for receiving the memory module and a lump portion located in the accommodating slot and used for locking the memory module. However, when customers did not notice the ejector and brute force to pull the memory module, it is easy to make the ejector fallen off the card edge connector and make the lump portion of the ejector damaged.

Therefore, an improved card edge connector is highly desired to meet overcome the requirement.

BRIEF SUMMARY OF THE INVENTION

An object of the present invention is to provide a card edge connector with an improved ejector assembled therein to stably grip a memory module.

In order to achieve above-mentioned object, a card edge connector includes an elongated insultive housing extending along a longitudinal direction, a plurality of conductive terminals retained in the insultive housing and an ejector retained at one longitudinal end of the insultive housing. The insultive housing defines a central slot recessed from an upper surface thereof for receiving a memory module. The ejector defines a base portion and a pair of gripping portions extending from the base portion along a vertical direction perpendicular to the longitudinal direction, said two gripping portions have an accommodating slot located therebetween and running therethrough in the longitudinal direction for receiving the memory module and a latching means located in the accommodating slot for locking the memory module. The latching means defines an opening communicating with said accommodating slot, a first lump portion and a second lump portion separated from each other by the opening.

Other objects, advantages and novel features of the invention will become more apparent from the following detailed description of the present embodiment when taken in conjunction with the accompanying drawings.

DESCRIPTION OF PREFERRED EMBODIMENT OF THE INVENTION

Figure 1:
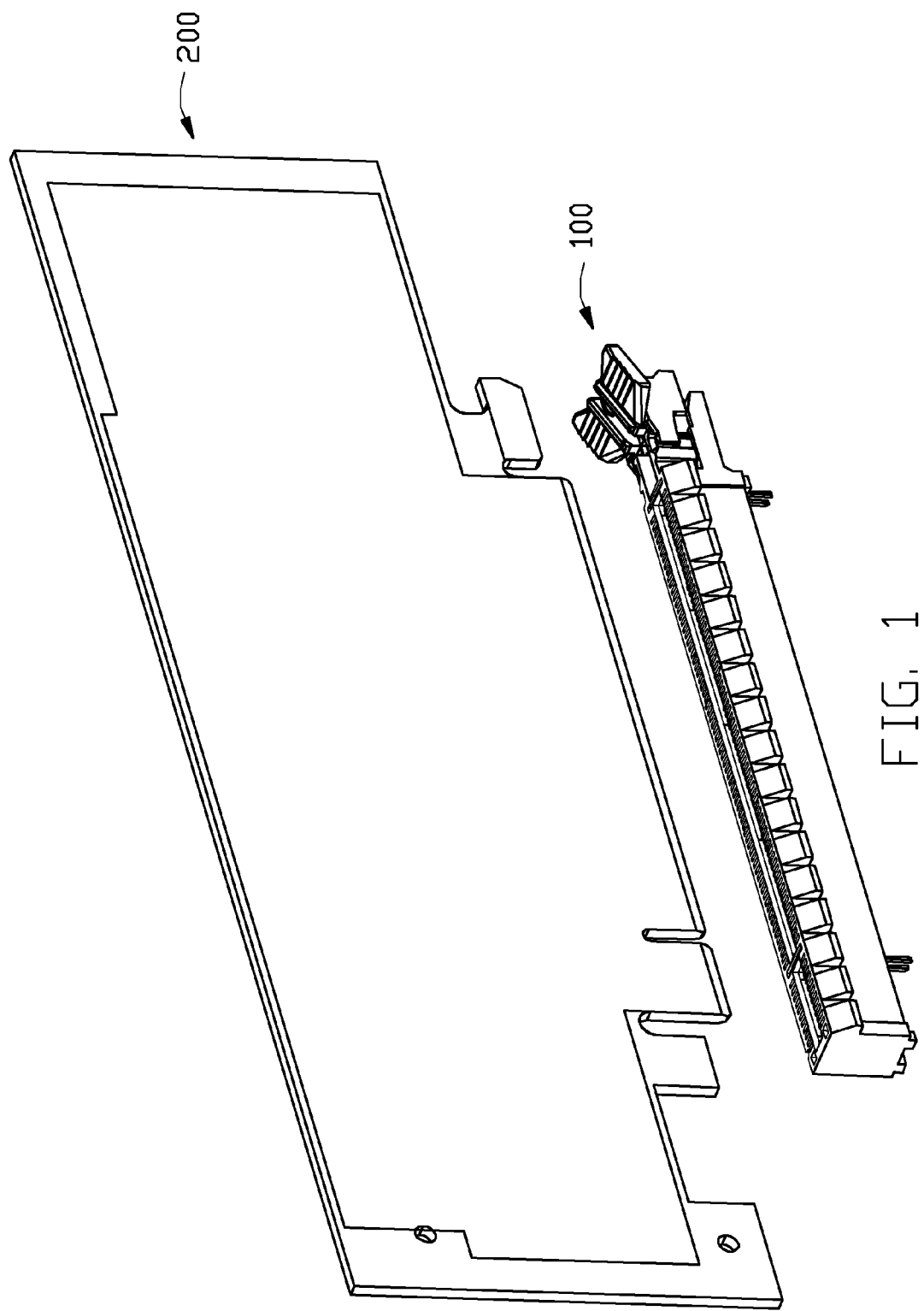
FIG. 1 is a perspective view showing a card edge connector with a memory module in accordance with the present invention.
Figure 2:
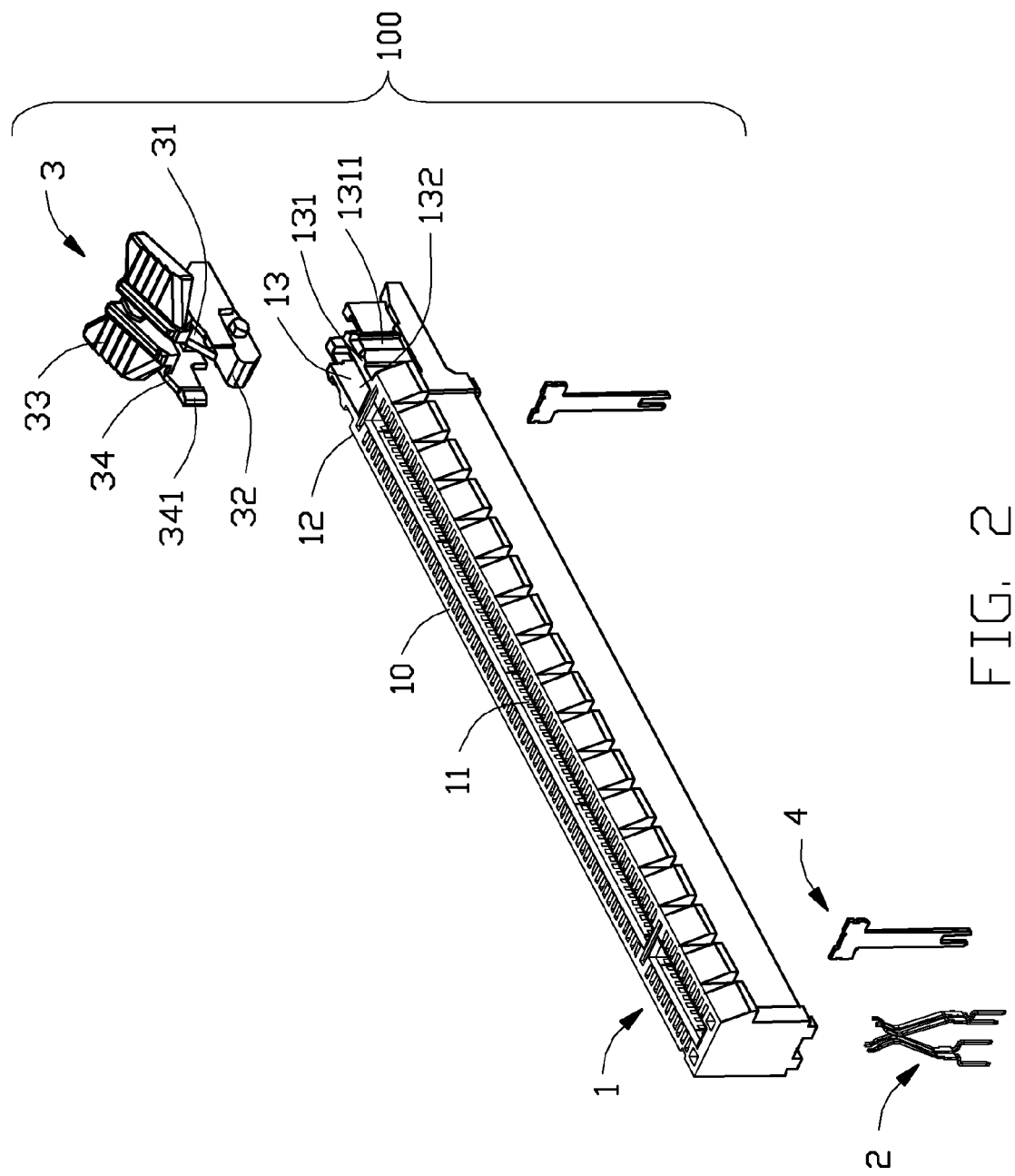
FIG. 2 is an exploded perspective view of the card edge connector shown in FIG. 1.

Reference will now be made to the drawing figures to describe a preferred embodiment of the present invention in detail. Referring to FIG. 1 to FIG. 2, a card edge connector 100 is preferably a memory socket to be mounted on a mother printed circuit board and includes an elongated insulative housing 1 extending along a longitudinal direction, a plurality of conductive terminals 2 retained in the insulative housing 1, an ejector 3 pivoted on one longitudinal end of the insulative housing 1 and latching a notch (not labeled) of a memory module 200 and a pair of board locks 4 mounted onto a bottom of the insulative housing 1.

The insulative housing 1 defines a central slot 11 recessed from the upper surface 10 thereof and used for receiving the memory module 200 and an attaching portion 13 extending outside from the end wall 12 of the insulative housing 1. The attaching portion 13 defines a pair of opposite side walls 131 and an attaching space 132 formed between the side walls 131.

The ejector 3 is retained in the attaching portion 13 and includes a base portion 31, an ejector portion 32 extending inwardly to the attaching space 132 from a lower end of the base portion 31, a pair of gripping portions 33 extending upwardly and aslant from the base portion 31 along a vertical direction perpendicular to the longitudinal direction and a pair of extending portions 34 extending toward the attaching portion 13 from both sides of the base portion 31. The ejector portion 32 is used to eject the memory module 200 and has a pair of pivotal shafts located at two outer lateral sides thereof and received into the attaching space 132. Each extending portions 34 defines a protruding portion 341 located in a front thereof and extending inwardly thereof, and the attaching portion 13 defines a pair of retaining slots 1311 located in two side walls 131 thereof and latched with the corresponding protruding portions 341 to prevent the ejector 3 from rotating up and down.

Figure 3:
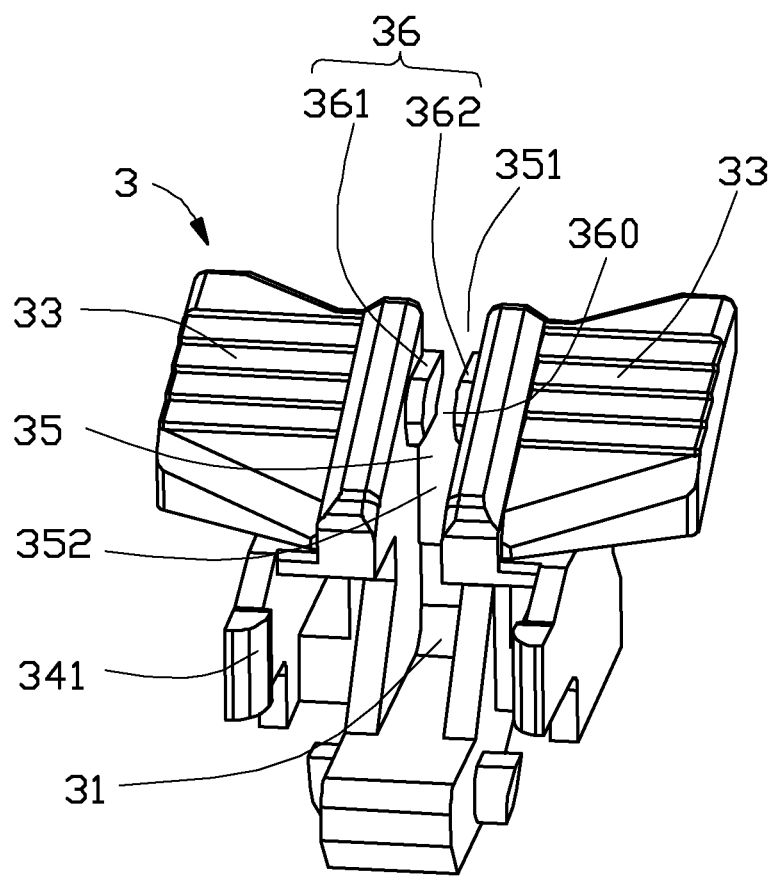
FIG. 3 is a perspective view of the ejector of the card edge connector shown in FIG. 1.
Figure 4:
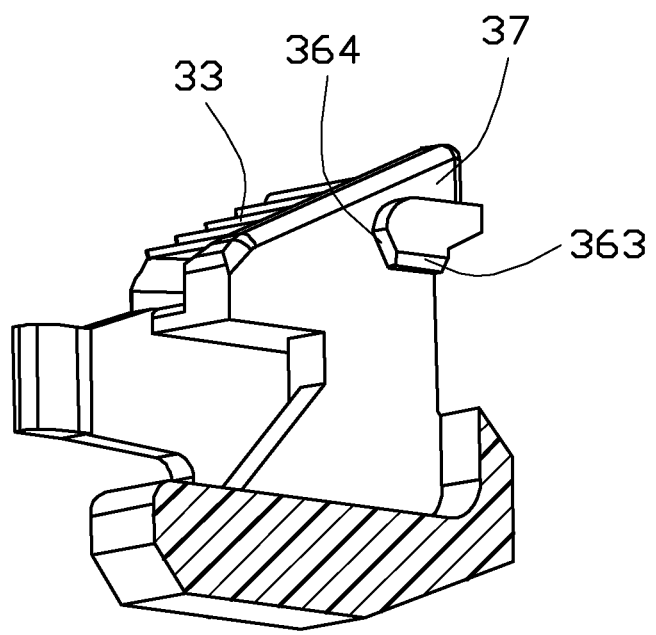
FIG. 4 is a cross-sectional view of the ejector shown in FIG. 3.

Referring to FIG. 3 to FIG. 4, two gripping portions 33 of the ejector 3 have an accommodating slot 35 located therebetween and running therethrough in the longitudinal direction for receiving the memory module 200 and a latching means or lump portion 36 located in the accommodating slot 35 and used for locking the memory module 200. Notably, each gripping portion 33 provides a transversely extending wing region with an upward figure operation/pressing area for the user to downwardly press, and the latching means 36 is located essentially at the same level with the wing region. The accommodating slot 35 further includes a first accommodating slot 351 located above the latching means 36 and running through the top surface of the ejector 3 and a second accommodating slot 352 located below the latching means 36 for receiving the bottom edge of the memory module 200. There is a certain distance from the latching means 36 to the top surface of the ejector 3, thereby two gripping portions 33 form a pair of clamping walls 37 located two sides of the first accommodating slot 351 to clamp the memory module 200 so as to enable the memory module 200 better retained in the insulative housing 1 in a transverse direction.

When the memory module 200 is inserted into the central slot 11 of the card edge connector 100, the ejector 3 is latching with the memory module 200. Wherein the memory module 200 is larger and easy to shield the ejector 3, the ejector 3 is easily overlooked by the user so that the user usually does not notice the ejector 3 and brutally force to pull the memory module 200, which makes the ejector 3 fallen off from the card edge connector 100 and makes the latching means 36 of the ejector 3 damaged. In the present embodiment, the latching means 36 defines an through opening or a slit 360 to have a first lump portion 361 and a second lump portion 362 separated from each other. The first lump portion 361 and the second lump portion 362 are projecting integrally from two gripping portions 33 respectively into said accommodating slot, the first accommodating slot 351 and the second accommodating slot 351 are communication with the opening 360. When the user is pulling the memory module 200 with the brute force, because of the opening 360 of the latching means 36, the memory module 200 abuts against the first lump portion 361 and the second lump portion 362, which makes two gripping portions 33 having outwardly elastic tension so that the memory module 200 can be pull out via the opening 360.

Further, the opening 360 is disposed in the intermediate position of the latching means 36 so that the first lump portion 361 and the second lump portion 362 are symmetrical, the width of the opening 36 is smaller than the thickness of the memory module 200 in order to avoid the memory module 200 from loosing from the opening 360 when the memory module 200 is inserted into the card edge connector 100. Each of the first lump portion 361 and the second lump portion 362 defines a first guiding surface 363 disposed in the bottom thereof and a second guiding surface 364 adjacent to the first guiding surface 363 and disposed in a surface facing to the central slot 11. The first guiding surfaces 363 are used for guiding the memory module 200 pulled out security from the opening 360, and the second guiding surfaces 364 are used for guiding the memory module 200 inserted into the central slot 11 via the ejector 3. It is also noted that the pair of gripping portions 33 are essentially able to be slightly outwardly deflectable about an imaginary fulcrum point around the base portion 31 so as to enlarge the opening 36 for removable of the memory module 200 in a harsh forcible condition.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the board general meaning of the terms in which the appended claims are expressed.

What is claimed is:

1. A card edge connector, comprising:
   an elongated insultive housing extending along a longitudinal direction and defining a central slot recessed from an upper surface thereof for receiving a memory module;
   a plurality of conductive terminals retained in the insultive housing; and
   an ejector retained at one longitudinal end of the insultive housing and defining a base portion and a pair of gripping portions extending from the base portion along a vertical direction perpendicular to the longitudinal direction, said two gripping portions having a accommodating slot located therebetween and running therethrough in the longitudinal direction for receiving the memory module and a latching means located in the accommodating slot and used for locking the memory module; wherein
   the latching means defines an opening communicating with said accommodating slot, a first lump portion and a second lump portion separated from each other by the opening.

2. The card edge connector as described in claim 1, wherein the first lump portion and the second lump portion are projecting integrally from two gripping portions respectively into the accommodating slot.

3. The card edge connector as described in claim 2, wherein each of the first lump portion and the second lump portion defines a first guiding surface disposed in the bottom thereof and a second guiding surface adjacent to the first guiding surface and disposed in a surface facing to the central slot.

4. The card edge connector as described in claim 1, wherein the insulative housing defines an attaching portion extending outside from an end wall of the insulative housing, the attaching portion defines a pair of opposite side walls and an attaching space formed between the side walls, the ejector defines an ejector portion extending inwardly to the attaching space from a lower end of the base portion for ejecting the memory module.

5. The card edge connector as described in claim 4, wherein the ejector defines a pair of extending portions extending toward the attaching portion from both sides of the base portion, each extending portions defines a protruding portion located in a front thereof and extending inwardly thereof and the attaching portion defines a pair of retaining slots located in two side walls thereof and latched with the corresponding protruding portions.

6. The card edge connector as described in claim 1, wherein the accommodating slot further includes a first accommodating slot located above the lump portion and running through a top surface of the ejector and a second accommodating slot located below the lump portion for receiving a bottom edge of the memory module.

7. The card edge connector as described in claim 6, wherein the opening is disposed in the intermediate position of the lump portion so that the first lump portion and the second lump portion are symmetrical.

8. The card edge connector as described in claim 7, wherein the width of the opening is smaller than the thickness of the memory module.

9. An ejector adapted for being equipped with a card edge connector to lock a memory module inserted into the card edge connector, comprising:
   a base portion; and
   a pair of gripping portions extending upwardly from the base portion;
   an accommodating slot located between said two gripping portions and separating said two gripping portions from each other for receiving the memory module; and
   a pair of lump portions integrally protruding from said corresponding gripping portions and into said accommodating slot for locking the memory module; wherein
   the lump portions are isolated from one another by an opening so that the lump portions could be resiliently splayed away from each other under a condition that the memory module is removed out from the card edge connector directly in a hard-interference manner;
   an ejector pivotally mounted to one end of the housing in said longitudinal direction, said ejector including a base portion, an ejecting portion located below the base portion and extending into the central slot for ejecting the module, and a latch device located above the ejecting portion and aligned with the central slot along the longitudinal direction for locking in a notch of the memory module when said memory module is received within the central slot.

10. The ejector as described in claim 9, wherein each lump portion defines a first guiding surface disposed in the bottom thereof and a second guiding surface adjacent to the first guiding surface and disposed in a surface facing to the central slot.

11. The ejector as described in claim 9, wherein the accommodating slot includes a first accommodating slot located above the lump portion and running through a top surface of the ejector and a second accommodating slot located below the lump portion for receiving a bottom edge of the memory module, the first accommodating slot and the second accommodating slot are communication with the opening.

12. The ejector as described in claim 11, wherein the opening is disposed in the intermediate position of the lump portion so that the first lump portion and the second lump portion are symmetrical, and a width of the opening is smaller than a thickness of the memory module.

13. An electrical connector for use with a memory module, comprising:
an insulative housing having a central slot extending along a longitudinal direction and upwardly open to an exterior in a vertical direction perpendicular to said longitudinal direction for receiving said memory module therein;
a plurality of contacts disposed in the housing beside said central slot in a transverse direction perpendicular to both said longitudinal direction and said vertical direction; and
an ejector pivotally mounted to one end of the housing in said longitudinal direction, said ejector including a base portion, an ejecting portion located below the base portion and extending into the central slot for ejecting the module, and a latch device located above the ejecting portion and aligned with the central slot along the longitudinal direction for locking in a notch of the memory module when said memory module is received within the central slot; wherein
the latch device includes a pair of lump portions spaced from each other with a through slit therebetween in the transverse direction.

14. The electrical connector as claimed in claim 13, wherein each of said lump portion defines an upward guiding surface around the through slit for facilitating enlargement of the through slit during a harsh forcible upward movement of the memory module.

15. The electrical connector assembly as claimed in claim 13, wherein said through slit is expandable in the transverse direction for complying with a harsh forcible upward movement of the memory module to allow the memory module to upwardly pass therethrough.

16. The electrical connector assembly as claimed in claim 15, wherein the pair of lump portions are able to move away from each other to enlarge the through slit in the transverse direction via deformation about an imaginary fulcrum point around a base portion.

17. The electrical connector as claimed in claim 13, wherein said through slit is dimensioned slightly smaller than a thickness of the memory module for efficiently locking the memory module in a normal use while being able to be enlarged in the transverse direction for allowing upward movement of the memory module in a harsh forcible condition.

18. The electrical connector as claimed in claim 17, wherein the ejector includes a pair of gripping portions for sandwiching the memory module therebetween, an accommodating slot is formed between the pair of gripping portions and in alignment with the central slot for receiving the memory module therein, the latch device is located within the accommodating slot, and the pair of lump portions are respectively formed on interior surfaces of the pair of corresponding gripping portions, respectively.

19. The electrical connector as claimed in claim 13, wherein the ejector includes a pair of pivotal shafts located at a same level with the ejecting portion, and the latch device is spaced from and located on an outer side of the pivotal shafts along the longitudinal direction in a top view.

20. The electrical connector as claimed in claim 19, wherein the ejector provides a pair of gripping portions with an accommodating slot therebetween in the transverse direction for receiving the memory module, each of the gripping portions forms a transverse extending wing region for finger operation, and the latch device is located within the accommodating slot essentially at a same level with the wing region.

* * * * *